Dec. 1, 1970 H. MEYER ET AL 3,544,947

TUNING DEVICE FOR HIGH FREQUENCY COMMUNICATION

Filed Feb. 6, 1969 3 Sheets-Sheet 1

INVENTORS

HERBERT MEYER AND RUDOLF MAYER

BY Craig, Antonelli, Stewart & Hill

ATTORNEYS

INVENTORS
HERBERT MEYER AND RUDOLPH MAYER

BY Craig, Antonelli, Stewart & Hill
ATTORNEYS

INVENTORS
HERBERT MEYER AND RUDOLPH MAYER

BY Craig, Antonelli, Stewart & Hill
ATTORNEYS 3,544,947
TUNING DEVICE FOR HIGH FREQUENCY COMMUNICATION Herbert Meyer, Rottweil-Buhlingen, and Rudolf Mayer, Rottweil, Germany, assignors to Messrs. R. & E. Hopt KG, Rottweil, Germany Filed Feb. 6, 1969, Ser. No. 797,052
Claims priority, application Germany, Feb. 7, 1968, 1,616,263, 1,616,264
Int. Cl. H01c 9/08
U.S. Cl. 338—179 25 Claims

ABSTRACT OF THE DISCLOSURE

A tuning device for high frequency communication apparatus, in particular television receivers, comprises two parallel rows of switch rods and tuning spindles associated with tuning elements, each switch rod being associated with and disposed parallel to one of the said tuning spindles and displaceable relatively thereto in a longitudinal direction to effect operation of the tuning element associated with the respective tuning spindle, and rocker buttons connected to pairs of the said switch rods, each of the said rocker buttons being pivotally connected to a switch rod in the said one row and to a switch rod in the said other row to permit selective alternate operation of the said switch rods of the said pair.

Figures 1, 2, 3:
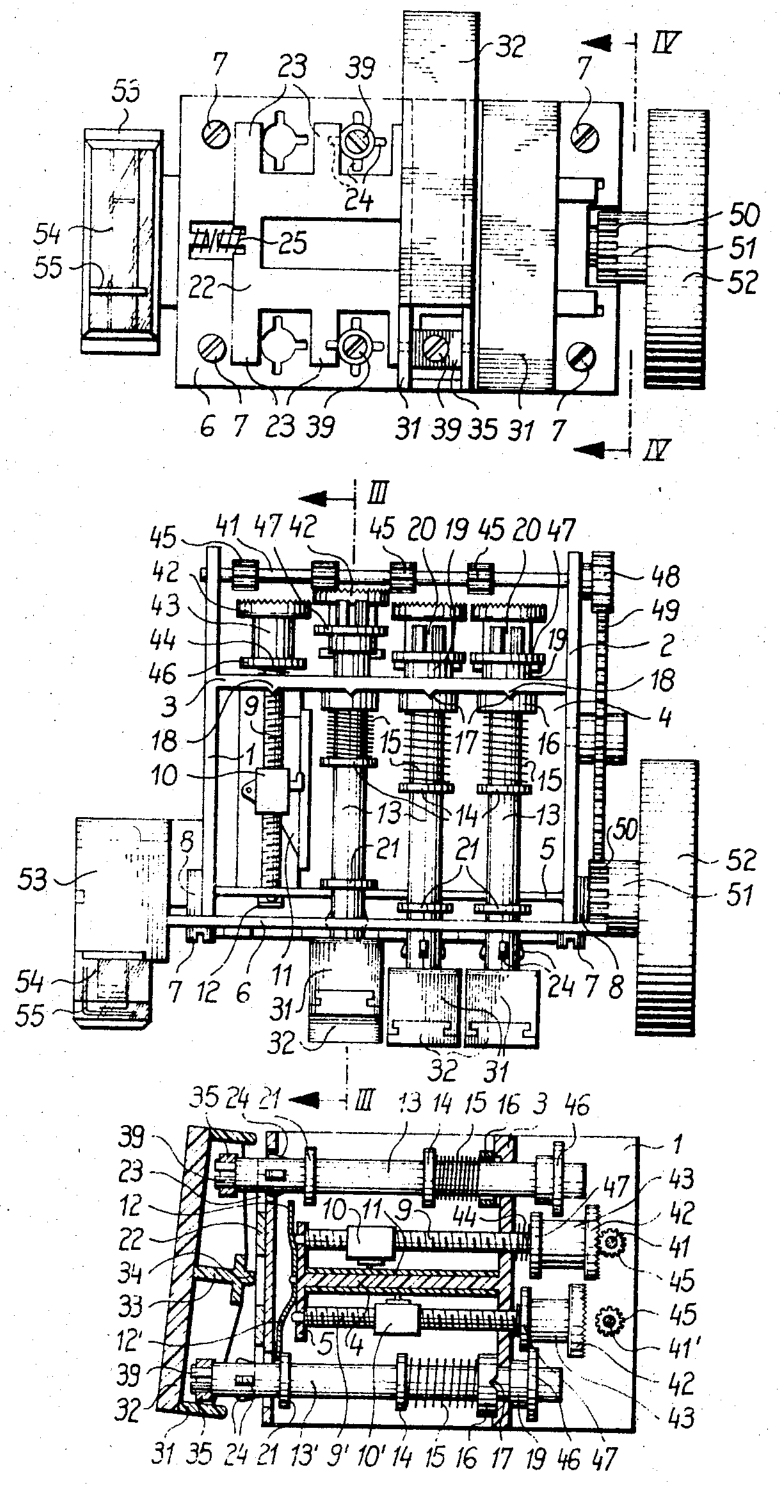

This invention relates to a tuning device for high frequency communication apparatus, in particular for television receivers, having a plurality of tuning spindles which are disposed parallel to each other in a housing and affect a tuning element, and switch rods which are associated with the tuning spindles and are displaceable in the housing parallel to the spindles, the tuning element coupled with a tuning spindle to be selected and to be made operative by selective depression of the associated switch rod.

In the tuning devices of this kind known heretofore the switch rods are all disposed in a row side by side and each of them is provided with a button or a key for effecting depression. If a tuning devce has a large number of such units consisting of a tuning spindle and a switch rod, the tuning device has a considerable constructional length which may lead to considerable difficulties in the assembly of such a device. The invention is based on the problem to avoid this disadvantage of the known tuning devices and at the same time to arrange the buttons in such manner that they are clearly visible in spite of their compact disposition and can be easily operated.

This object is attained according to the invention in that the switch rods are located in two rows parallel in oppositely disposed pairs and that the switch rods of each oppositely disposed pair of switch rods is coupled with a rocker button in such manner that by selective depression of the rocker button the one or the other of the two switch rods of the pair can be displaced.

By this construction the length of the tuning device is halved without producing thereby a confusing button arrangement or a button arrangement which is difficult to actuate because of the close arrangement of the buttons. On the contrary, the number of buttons is also reduced to one-half, and because a depressed rocker button is in an inclined position it is easily seen which of the individual units of the tuning device is switched on. At the same time the relatively large area of a button provides space for clearly readable inscriptions or other signs.

In a preferred embodiment of the invention, the rocker buttons are pivotally fixed exclusively at the ends of the two associated switch rods. This arrangement of the rocker buttons has considerable advantages. The rocker button is not only connected to the two associated switch rods in a very simple manner, but it is also possible to depress the two associated switch rods alternately, because the rocker button is always pivotal about the end of the other rod, and thereby to release the other for from its depressed position. For holding the rods in their depressed position, a locking slider may be used in a known manner which engages in the operative position of a rod behind an abutment provided on each rod, when any other rod is depressed the slider is displaced by the respective abutment with the effect that the previously depressed rod is released. If the rocker button were mounted in its centre alternate actuation of the two switch rods associated with the same button would be possible only if the rocker button were not securely connected to these rods, but would serve only for exerting a pressure upon the ends of the rod. In this case, special means would have to be provided in order to detain the rocker button in its depressed position in an easily releasable manner. A further advantage of the connection of the rocker button to the two switch rods associated therewith resides in the fact that for the same rod displacement path, the button must be pivoted through a smaller angle than in the other construction, because the pivot radius is always approximately equal to the spacing between the two associated switch rods. Furthermore, the end of the button which is not depressed does not project from the plane containing the surface of the buttons in this kind of mounting. Nevertheless it is perfectly clear which button has been actuated, and also there is no danger that the depressed button is inadvertently released by knocking against the projecting part thereof.

In this embodiment of the invention, an abutment may be provided for each rocker button between the associated oppositely disposed rods of a pair of switch rods for the purpose of limiting a parallel movement of the rocker button and thereby preventing a simultaneous depression of the two switch rods coupled to the rocker button. This abutment may be formed in a simple manner by a transverse rail located on the back of the rocker button and arranged to come into engagement with the front plate of the housing.

A particularly simple construction of the tuning device according to the invention is obtained when the rocker buttons have a U-shaped cross-section and their side walls are engaged by bearing pins which are connected to the upper ends of the switch rods. Rocker buttons having the desired cross-section can be easily produced from a synthetic resin material and the connection between the switch rods and the rocker button can be effected by bearing pins inserted therein, thereby leading to a very simple assembly. It is particularly advantageous if longitudinal slots are provided in the side walls of the rocker buttons for the bearing pin of at least one of the two switch rods, each slot extending at one end into a transverse slot which extends to the edge of the side wall. The pins can then be inserted simply into the slots which are open towards the edges of the side walls. Simultaneously, the longitudinally directed slot portion permits the increase of the bearing spacing between the ends of the two associated switch rods, which occurs in an oblique position relatively to the rest position.

In a further development of the invention, the switch rods may be provided at their ends with transverse rails which are pivotally mounted between the side walls of the U-shaped rocker button. These transverse rails facilitate not only for example the insertion of bearing pins and give a well-defined transverse guidance to the rocker buttons, but the transverse rails may also be provided with openings in the central region thereof into which slotted ends of the switch rods engage. Projections may be provided at these slotted ends of the switch rods and may engage behind the surfaces of the transverse rails so that the switch rods are securely and tightly connected to the transverse rails; the connection, however, can be easily produced simply by pushing the rods into the openings and can also be easily released again when required. A particular advantage of this arrangement consists in that the switch rods are rotatable in the transverse rails so that in a further development of the invention cams can be disposed at the periphery of the switch rods for the purpose of band switching, these cams co-operate for band switching with switch sliders disposed at the housing and can be brought into selected engagement with these sliders by rotation of a respective switch rod about its longitudinal axis. In this case, the upper ends of the switch rods may be accessible through openings disposed on the upper side of the rocker button. In this embodiment it is advantageous to mount helical compression springs on the switch rods, which are supported on a collar disposed on the switch rod and on the rear wall of the housing and which have the object to return the respective switch rod into the rest position after its release from the depressed position. In this case, namely detention rings may be displaceably but non-rotatably mounted on the switch rods between the helical compression springs and the rear wall of the housing, the rings being always pressed by the spring against the rear wall of the housing and having detent which co-operate with corresponding detent means on the rear wall of the housing.

In one embodiment of the invention, a rocker button is provided with a slide cover which normally completely covers the button, but which can be displaced to give access to the ends of the switch rods and in some cases to further adjusting or indicating means.

Thus, for example, one embodiment of the invention provides that the two tuning spindles associated with a pair of switch rods are disposed between the two switch rods and the tuning elements disposed on the tuning spindles, in particular potentiometer wipers, are connected to the end of a coiled spring strip the rolled up portion of which is located adjacent to the end of the associate switch rod below the rocker button and which carries a scale marking which is visible through the rocker button or after displacement of the slide cover thereof. In this very simple manner the value can be indicated to which each individual tuning spindle is adjusted so that complicated arrangements for transferring the adjusted values to a common dial scale are unnecessary. For example, the common dial scale could be constituted by the scale of a measuring instrument which is tapped by the potentiometer associated with the depressed rocker button.

For performing their function, the switch rods may be provided with one or more collars, which, when the rods are depressed, actuate spring contacts for bringing into operation the associated tuning element the coupling of a central tuning arrangement, contacts for dial scale illumination or other switching members. A rod with such a collar or collars can be produced very simply, and these collars permit reliable operation of switching members of any desirable kind independently upon the angular position of the switch rod which is rotatable about its axis. In particular the collars provided on the switch rods preferably hold the members to be switched in a rest position, and the members to be switched are preferably subjected to the effect of springs which move the members into the operative position after release by the switch rod. In this manner a particular high operative reliability is obtained.

The tuning device according to the invention may also be provided with a device for illuminating the depressed part of a rocker button. Thus, for example, it would be possible to associate a lamp with each end of each rocker button and to connect it to a voltage source by means of a switch which is actuated by the associated switch rod when the latter is depressed and which is thereby caused to light up. Such an arrangement, however, would be relatively expensive. A further embodiment of the invention therefore provides that the illumination device is formed by light conductors the beam path of which is disturbed by the pressed portion of a rocker button in such manner that light transmitted by the light conductor leaves through this portion of the button. In this case, therefore, switches associated with the individual switch rods and separate lamps for each end of the rocker buttons are not required. Thus, for example, a light conductor may be disposed across the ends of the rocker buttons and its surface facing the ends may have recesses into which the end of a depressed rocker button engages. As long as the end of a rocker button is in its rest position, the button lies outside the range of illuminated areas of the light conductors, whereas the end of a depressed button is illuminated by the illuminated transverse faces of the recess into which the button engages so that the end of the depressed button also emits light.

Alternatively the rocker buttons may be provided with light conducting sections which are flush with each other in the rest position of the rocker buttons and together form a light conductor, whereas when a rocker button is depressed the light conductor is interrupted in the region of the depressed button end so that light leaves there.

In all embodiments of the invention in which the illumination device makes use of light conductors, the surface of the rocker buttons may be provided with projections or depressions which favour the exit of light and which are preferably in the form of letters, symbols or other signs.

Figures 4, 5, 7:
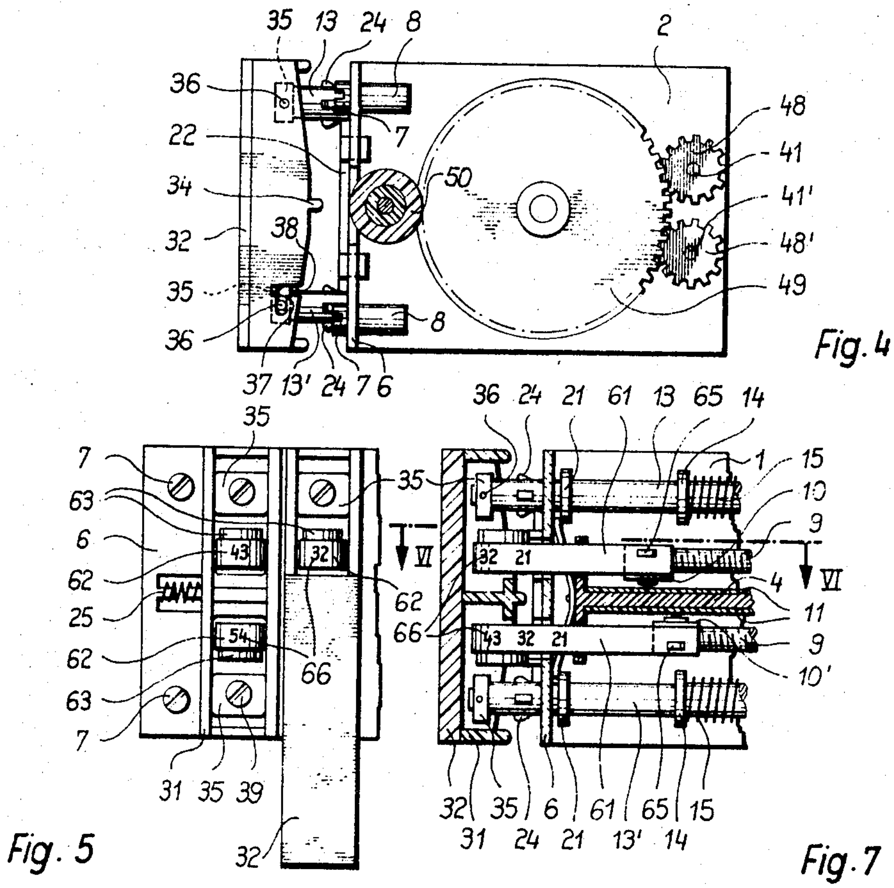
Figure 6:
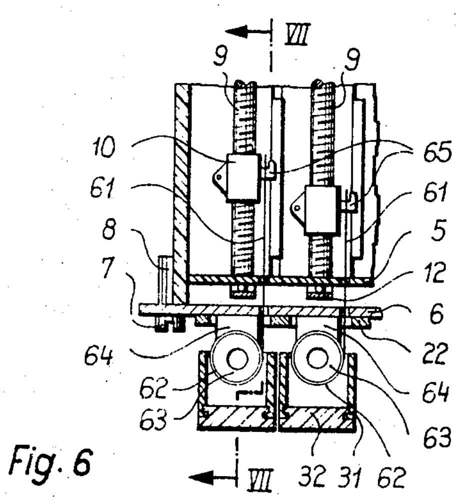
Figure 8:
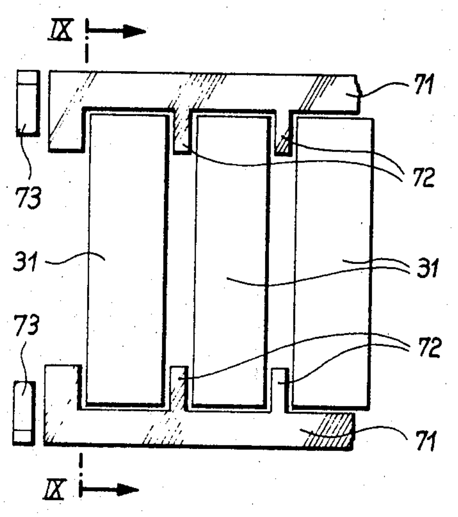
Figure 9:
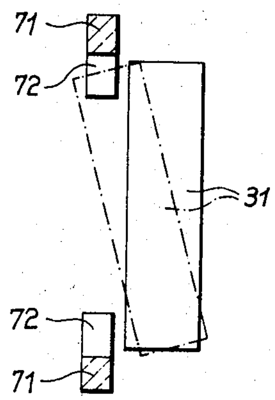
Figure 10:
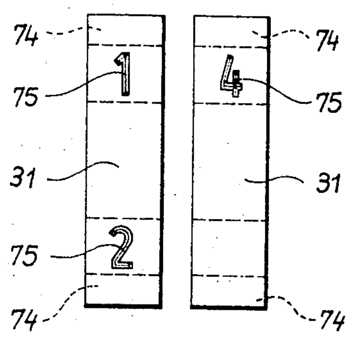
Figure 11:
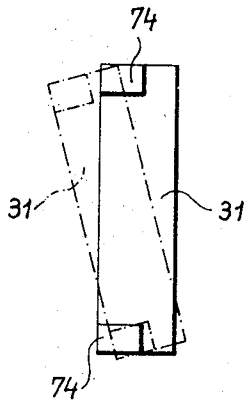

Further details and embodiments of the invention are clear from the following description in which the invention is described and explained in detail by way of example with reference to embodiments illustrated in the accompanying drawings. The features which may be seen from the description and the drawings may be used in other embodiments of the invention individually by themselves, or several in any desirable combination. In the drawings:

FIG. 1 is a plan view of a first tuning device according to the invention in which two of the four rocker buttons provided and two of the altogether eight switch rods have been omitted, FIG. 2 is a side view of the device according to FIG. 1 in which only one rocker button and one switch rod have been omitted, FIG. 3 is a section along the line III—III through the device according to FIG. 2, FIG. 4 is a section along the line IV—IV through the device according to FIG. 1, FIG. 5 is a partial view similar to FIG. 1, of a further embodiment of the invention in which a dial scale is associated with each tuning spindle, FIG. 6 illustrates the device according to FIG. 5 partly in side view and partly in section along the line VI—VI in FIG. 7, FIG. 7 illustrates the device according to FIG. 5 partly in end view and partly in section along the line VII—VII in FIG. 6, FIG. 8 is a diagrammatic view of part of a button arrangement of a tuning device according to the invention, with light conductors disposed on the outside, FIG. 9 is a section along the line IX—IX through the arrangement according to FIG. 8, FIG. 10 is a diagrammatic plan view of the button arrangement of a further embodiment of the invention, with a built-in light conductor, and FIG. 11 is a side view of the button arrangement according to FIG. 10.

The embodiment of the invention illustrated in FIGS. 1 to 4 is provided with a housing which is produced from a synthetic resin and which comprises two side walls 1 and 2, a rear wall 3 located between the ends of the side walls, and an intermediate partition wall 4 which is disposed perpendicularly to the walls 1, 2 and 3 and which extends nearly to the forward edge of the side walls 1 and 2; a rail 5 is disposed at the forward edge of the partition wall 4 and is connected to the side walls 1 and 2. A metallic front plate 6 rests on the forward ends of the side walls 1 and 2 and it attached thereto by means of screws 7 which engage into bushes 8 provided in the side walls 1 and 2. Tuning spindles 9 and 9' provided with screw threads are rotatably mounted in the rail 5 and the rear wall 3 and are disposed in two parallel rows on both sides of the partition wall 4. Travelling nuts 10 are disposed on the spindles 9 and 9' provided with the screw threads and form the sliders of potentiometers resistive tracks 11 of which are attached to the two sides of the partition wall 4. A potential can be applied to the ends of the resistive tracks 11 in a manner not illustrated in detail, so that by means of the sliders 10 a selectable potential can be taken off the potentiometers and can be used for example for controlling a capacitance diode of a tuning circuit.

For the purpose of effecting selective operation of one of these potentiometers of which altogether eight are provided in the tuning device illustrated, leaf spring contact blades 12 and 12' are provided which project from a collector rail attached to the front edge of the rail 5 and which under the effect of their inherent tension tend to engage the ends of the metallic tuning spindles 9 and 9'. For actuating the contact blades 12 and 12' switch rods 13 and 13' are provided which are mounted in the rear wall 3 and in the front plate 6 of the housing for displacement parallel to the tuning spindles 9 and 9'. Always one switch rod 13 or 13' is associated with a tuning spindle 9 or 9', respectively, and these switch rods are also disposed in two mutually parallel rows, namely in such manner that always two switch rods 13 and 13' of a pair of switch rods are located opposite each other in the two rows and comprise between them a pair of tuning spindles 9 and 9'. In the region between the rear wall 3 and the front plate 6, a collar 14 is provided on each of the switch rods 13 and 13' and a helical compression spring 15 is disposed on each switch rod and one end thereof is supported thereon. The other end of the helical compressing spring loads a detent ring 16 which is displaceably but non-rotatably mounted on the switch rod 13 or 13'. The ring rests against the rear wall 3 of the housing and has detent notches 17 on its end face adjacent to the rear wall into which a projection 18 provided on the rear wall 3 of the housing can engage. In this manner the switch rods 13 or 13' can be detained in a plurality of selected angular positions relatively to their longitudinal axis.

Each of the ends of the switch rods 13 and 13' projecting from the rear wall 3 of the housing, is provided with a pushed-on abutment ring 19 which in the rest position of the switch rod is moved into abutting engagement with the outside ot the rear wall 3 by means of the springs 15 and thereby determines the rear position of the switch rods. The rearward end of the switch rod is provided with a slot 20 so that two resilient end members are produced which can resiliently engage by means of projections behind the rearward end face of the abutment rings 19 so that, after they have been pushed onto the switch rod, the abutment rings are tightly held. Furthermore the switch rods 13 and 13' are provided with a collar 21 near the front plate 6, by means of which they engage behind the ends of the contact blades 12 or 12' in their rest position and lift them off the ends of the tuning spindle 9 or 9'. Consequently, the potentiometers whose associated switch rods 13 and 13' are in the rest position, are separated from the collector rail having the contact blades 12 and 12' so that only the one potentiometer is connected to the collector rail the associated switch rod of which releases the contact blade 12 or 12'. The two right-hand switch rods 13 illustrated in FIG. 2 and the lower switch rod 13' illustrated in FIG. 3 are in the rest position. In contrast, the left-hand switch rod 13 in FIG. 2 and the upper switch rod 13' in FIG. 3 are shown in the operative position in which the contact blade 12 is released for engagement with the end of the tuning spindle 9 projecting from the rail 5.

The switch rods 13 and 13' can be transferred into the operative position by depressing, that is to say by an axial displacement, against the force of the spring 15. They are held in the depressed position by a locking slider 22 which is displaceably mounted on the front side of the front plate 6 and which has laterally projecting arms 23 by means of which, as illustrated in FIG. 1, it engages behind a projection 24 radially projecting from the switch rod 13 or 13'. Four such projections 24 are provided on each switch rod because the switch rod can assume four angular positions. The projections 24, as may be seen in particular from FIG. 3, lies in the rest position of the switch rods in front of the locking slider 22 and have inclined faces adjacent the locking slider, by means of which the locking slider can be displaced when a switch rod is depressed out of its rest position against the force of the respective spring 15 loading it, so that the slider releases the switch rod previously located in the operative position before the depressed rod attains its operative position which is therefore caught by the locking slider.

For the purpose of actuating the switch rods, there serve rocker buttons 31 which extend transversely to the two rows in which the switch rods 13 and 13' are disposed, and each button engages over the ends of a pair of oppositely disposed switch rods 13 and 13', as illustrated in particular in FIG. 3. As may be seen the buttons are constructed substantially box-like and are closed on their upper surface by a slide cover 32. The box is stiffened by an intermediate transverse rail 33 of which the end facing the front plate 6 projects beyond the edge of the rocker button and forms an abutment rail 34. Between the side walls of the rocker button 31, which has a U-shaped cross-section in the region of the ends of the switch rods 13 and 13', transverse rails 35 are pivotally mounted by means of bearing pins 36 which engage in appropriate openings in the side walls of the rocker button 31. The opening for the bearing pins 36 of the one of the two transverse rails 35 is formed by a longitudinal slot 37 which is followed at an angle by a slot 38 extending as far as the rear edge of the side wall. Thereby assembly is simplified to a great extent and the slot 37 permits alteration of the spacing between the two bearing pins 36 disposed in a rocker button. For the purpose of connection with the switch rod 13 and 13', the transverse rails 35 have central openings into which the ends of the switch rods 13 and 13' provided with slots 39 engage resiliently in such manner that a shoulder thereof rests on the one side of a transverse rail and a collar thereof rests on the other side of the rail. In a manner similar to the case of the abutment rings 19 a secure tight connection between the ends of the switch rods 13 and 13' and the transverse rails 35 is produced in this way. At the same time the switch rods are rotatable relatively to the transverse rails. The rotation can be effected by means of a screwdriver which is inserted into the slot 39 at the end of the switch rod after the end of the switch rod has been made accessible displacement of the cover 32, as illustrated in FIG. 1. Rotation of the switch rod may be necessary in particular for the purpose of band switching if a switch cam is attached to the switch rod in a manner not illustrated in detail but known per se, which cam is arranged to move into engagement with switch sliders or switch rockers for band switching when the switch rod is depressed into its operative position.

As may be clear, depression of a switch rod is effected in the manner that a pressure is exerted on the end of the rocker button under which the end of the switch rod is located which is to be displaced. Thereby, the rocker button pivots about the end of the other switch rod until it assumes the inclined position illustrated in FIG. 3 in which the upper switch rod 13 is locked in its operative position by the locking slider 12. The particular advantage of this arrangement resides in the fact that the lower switch rod 13' can be displaced even out of the depressed position illustrated in FIG. 3 by pressure exerted upon the lower end of the rocker button 31, because the rocker button can now be pivoted about the end of the upper switch rod 13. Thereby the locking slider 22 is released by means of the projections 24, and the upper switch rod 13 is released so that it returns into its starting position. The pivot point for the rocker button is removed thereby from the front plate 6 sufficiently to enable the rocker button to be pivoted until detention of the lower switch rod 13 occurs without the abutment rail 34, which is provided in the centre of the button, coming into abutment with the front plate 6 of the housing. This rail 34 has the purpose to prevent simultaneous depression of the two switch rods 13 and 13' connected to a rocker button, when pressure is exerted on the centre of the rocker button. A further advantage of this arrangement consists in that the lever length when the rocker button is displaced, is substantially equal to the whole length of the button, so that the pivot angle of the rocker button remains relatively small in relation to the path length provided for the switch rods. Furthermore, the not depressed end of an actuated button does not project considerably above the surfaces of the other not depressed buttons, so that the depressed end of the button indicates clearly which constructional unit of the tuning device is operative.

The tuning device illustrated in FIGS. 1 to 4 is provided with a device for central tuning. This device has two tuning shafts 41 and 41' which are mounted in the portions of the side walls 1 and 2 of the housing which project beyond the rear wall 3, the tuning shafts extend at a spacing across the ends of the tuning spindles 9 or 9' which project in respective rows from the rear wall 3. Crown wheels 42 are mounted on these projecting ends by means of sleeves 43 in a displaceable but non-rotatable manner not illustrated in detail, and are pressed by means of helical compression springs 44 in the direction towards pinions 45 which are disposed on the shafts 41 and 41' in such manner that the crown wheels 42 can be moved into engagement therewith under the force of the springs 44 which are supported on the outside of the rear wall 3. Normally, however, the crown wheels 42 are held out of engagement with the pinions 45 on the tuning shafts 41 and 41' by collars 46 provided on the abutment rings 19 pushed onto the ends of the switch rods 13 and 13', and engage behind collars 47 on the sleeves 43 of the crown wheels 42. Only the collar 46 at the abutment ring 19 of the switch rod which has been depressed into the operative position, as is the case for the upper switch rod 13 in FIG. 3 releases the collar 47 on the sleeve 43 of the crown wheel 42 of the respective unit, so that this crown wheel is moved into engagement with the pinion 45 on the tuning shaft 42 by means of the spring 44. Further gear wheels 48 and 48' are disposed at the ends of the tuning shafts 41 and 41' projecting from the side walls 2 and both wheels mesh with a gear wheel 49 of larger diameter which is mounted on the outside of the side wall 2 and which in turn meshes with a pinion 50 which is attached to the end of the hub 51 of an adjusting wheel 52. This adjusting wheel extends parallel to the rocker buttons 31, and the plane defined by the surface of the rocker button is substantially tangential to its periphery.

Indication of the tuning position is effected in this embodiment of the invention by means of a measuring instrument 53 which is disposed on the side of the housing opposite the adjusting wheel 52 and which is supplied with a potential which is proportional to the potential tapped of the respective operative potentiometer. A dial scale 54 of the measuring instrument 53 is marked for example in such manner that an instrument pointer 55 indicates the tuning portion which is obtained by means of the depressed button of the operative potentiometer.

The embodiment of the invention illustrated in FIGS. 5 to 7 differs from the embodiment according to FIGS. 1 to 4 only by a different dial scale arrangement. Therefore, the component parts of the embodiment according to FIGS. 5 to 7 which are similar to the parts of the embodiment according to FIGS. 1 to 4 have been provided with the same reference numerals and are not explained again.

Whereas in the embodiment according to FIGS. 1 to 4, indication of the adjusted tuning position occurred on a dial scale common to all selectable tuning units, in the embodiment according to FIGS. 5 to 7 each tuning unit is associated with its own dial scale. In this case self-retracting coiled spring strips 61 serve as dial scales and the rolled up section 62 of each spring strip is located within the associated rocker button 31 in front of the respective tuning spindle 9 or 9' and its inner end is fixed to a pin 63 which is attached to the front plate 6 by means of a laterally disposed ledge 64. The free end of the coiled spring strip 61 extends through an appropriate slot provided in the front plate 6 and is hooked into a lug 65 which projects laterally from the respective potentiometer slider 10, as illustrated in particular in FIG. 6 The outer surface of each spring strip is provided with markings 66 which indicate the value of the adjusted position. It is clear that the coiled spring strip is rolled on or off to a degree dependent upon the spacing of the potentiometer slider 10 from the front plate 6 of the housing so that the portion of the spring strip which is visible from the front of the button 31 is characteristic for the position of the potentiometer slider 10 and thus for the adjusted tuning position. In the embodiment illustrated, the rolled on portion of the spring strip 62 is visible only when the slide cover 32 of the button 31 is displaced. Alternatively a window may be provided in the upper surface of the button, through which the dial scale is continuously visible. It is also possible to provide perforations in the upper surface of the button, through which the upper end of the switch rods is accessible for band adjustment.

Furthermore, the depressed button end may be illuminated for better identification of the depressed button. For this purpose for example lamps may be disposed in the buttons or adjacent to the buttons and may be switched on by means of switches which are closed by the depressed switch rod. However, the amount of lamps and switches necessary for this purpose is fairly considerable. Therefore, embodiments of the invention provide that illumination of the depressed button end is effected by means of light conductors. Light conductors are bodies which are optically permeable although the light normally does not issue from the surfaces thereof. Suitable arrangements are illustrated in FIGS. 8 to 11.

In the embodiment according to FIGS. 8 and 9 a light conductor 71 is disposed at each of the two sides across the ends of the rocker buttons 31 and is arranged so that it lies below the lower edge of the rocker buttons when these buttons are in their normal position as illustrated by a full line in FIG. 9. These light conductors have recesses 72 in their faces adjacent to the button ends; the ends of the buttons are arranged to engage into the recesses when they are depressed as illustrated in FIG. 9 by a chain dotted line. The ends of the non-depressed buttons are not hit by the light which leaves the faces of the light conductor limiting the recesses 72, whereas the end of a depressed button entering into such a recess is illustrated by this light. In this case a lamp 73 is provided for each light conductor 71 for the purpose of illumination and may be permanently switched on when the apparatus is switched on so that no separate switch is required therefor. Nevertheless in this manner a depressed button end is softly illuminated in the desired manner so that it is clearly identifiable.

In the embodiment according to FIGS. 10 and 11, sections 74 consisting of a material which has the properties of an optical conductor are inserted in the corners of the rocker buttons 31 themselves. In the rest position of the buttons, these sections complement each other to form an optical conductor from which light does not issue to illuminate the buttons. When, however, a button is displaced, as illustrated in FIG. 11 by a chain dotted line, the upper region of the button enters into the path of the light which issues from the optically conducting section 74 of the adjacent button and the depressed button is illuminated. In order to facilitate the issue of the light from the upper surface of the button, depressions or projections may be provided therein which, as illustrated in FIG. 10, may have the form of symbols 75. In this case also, one continuously burning lamp is sufficient for each light conductor arrangement in order to illuminate a depressed button.

It is understood that the invention is not limited to the embodiments illustrated by way of example, but that deviations therefrom are possible without the scope of the invention being exceeded. Thus, for example it is possible to dispose the partition wall with the resistance paths 11 in guides and to make it withdrawable from the housing in the rearward direction for servicing purposes. The resistive tracks may be attached to the partition wall by means of rivets which constitute at the same time desirable electrical connections. It is obvious that the spacing between coupling elements of the device for central tuning must be large enough to permit of the wall with the resistive tracks to pass therebetween.

What is claimed is:

1. A tuning device for high frequency signal transmission apparatus, in particular for television receivers comprising a housing, a plurality of switch rod means mounted in the said housing and disposed parallel to each other in two parallel rows, a plurality of tuning spindle means associated with tuning elements, each of the said tuning spindle means being arranged parallel to one of the said switch rod means and operationally associated therewith, each of the said switch rod means being displaceable in the longitudinal direction thereof to effect operation of the tuning spindle means and tuning element associated therewith, and a plurality of rocker button means connected to pairs of said switch rod means, each of said rocker button means being pivotally connected to a switch rod means in the said one row and to an oppositely located switch rod means in the said other row and arranged to permit selective alternate displacement of the said switch rod means of the said pair.

2. A tuning device according to claim 1, characterised in that the rocker buttons are pivotally attached exclusively at the ends of the two associated switch rods.

3. A tuning device according to claim 1, wherein between each pair of oppositely disposed switch rods an abutment for the associated rocker button is provided which limits parallel movement of the rocker button and thereby prevents simultaneous depression of the two switch rods coupled by the rocker button.

4. A tuning device according to claim 3, wherein the abutment is constituted by a transverse rail at the rear side of the rocker button and is arranged to come into engagement with the front plate of the housing.

5. A tuning device according to claim 1, wherein the rocker buttons have a U-shaped cross-section and wherein bearing pins are connected to the upper ends of the switch rods and engage into the side walls of the rocker buttons.

6. A tuning device according to claim 5, wherein longitudinal slots are provided in the side walls of the rocker buttons for receiving the bearing pins of at least one of the two switch rods and extend at one end into a transverse slot extending as far as the edge of the side wall.

7. A tuning device according to claim 5, wherein the switch rods are provided at their ends with transverse rails which are pivotally mounted between the side walls of the rocker buttons having a U-shaped cross-section.

8. A tuning device according to claim 7, wherein the transverse rails are provided in their centre with an opening and the switch rods are provided with slotted ends which engage into the openings and which have projections which engage behind the faces of the transverse rails.

9. A tuning device according to claim 1, wherein cams for band switching are disposed on the periphery of the switch rods for co-operation with switch sliders disposed on the housing for band switching, each cam being arranged to be brought selectively into engagement with the respective slider by rotation of the switch rod about its longitudinal axis, and wherein the upper ends of the switch rods are accessible through openings in the surface of the rocker button.

10. A tuning device according to claim 1, wherein helical compression springs are disposed on the switch rods and are supported by a collar disposed on the switch rod and by the rear wall of the housing, and that between each helical compression spring and the rear wall of the housing a detent ring is displaceably but non-rotatably mounted on the switch rod, which is always pressed against the rear wall of the housing by the spring and which has detent means which co-operate with corresponding detent means on the rear wall of the housing.

11. A tuning device according to claim 9, wherein the rocker buttons are provided with a slide cover.

12. A tuning device according to claim 1, wherein the two tuning spindles associated with a pair of switch rods are disposed between the two switch rods and wherein the tuning elements disposed on the tuning spindles in particular potentiometer wipers, are connected to the end of a self-retracting coiled spring strip, the rolled up portion of which is located adjacent to the end of the associated switch rod below the rocker button and carries a dial scale marking which is visible through the rocker button or after displacement of the slide cover thereof.

13. A tuning device according to claim 1, wherein the switch rods are provided with one or more collars which, when the rods are depressed, actuate spring contact blades for bringing into operation the associated tuning element, a coupling member of a central tuning device, contacts for dial scale illumination or other switching members.

14. A tuning device according to claim 13, characterised in that the collars provided on the switch rod hold the members to be made operative in a rest position and wherein the members to be made operative are subjected to the force of springs which move them into the operative position after release by the switch rod.

15. A tuning device according to claim 13, wherein on each tuning spindle a gear wheel is disposed, which is attached to a bush displaceably but non-rotatably mounted on the tuning spindle, and which is pressed by a spring in the direction towards a further gear wheel which is attached to a shaft extending transversely to the tuning spindles and forms part of a device for central tuning.

16. A tuning device according to claim 15, wherein the gear wheels attached to the bushes are constructed as crown wheels and the further gear wheels disposed on the shaft are constructed as pinions.

17. A tuning device according to claim 1, wherein the row of tuning spindles is associated with a tuning shaft and the tuning spindles are connected to each other in driving connections.

18. A tuning device according to claim 17, wherein the tuning shafts are provided at their ends with gear wheels with which they engage into the same gear wheel of a driving device.

19. A tuning device according to claim 1, characterised in that a device for illuminating the depressed part of a rocker button is provided.

20. A tuning device according to claim 19, wherein the illumination device is constituted by light conductors the beam path of which is arranged to be disturbed by the depressed section of a rocker button in such manner that light transmitted by the light conductor issues from this button section.

21. A tuning device according to claim 20, wherein a light conductor is guided across each of the ends of the rocker buttons and is provided at its surface facing the button ends with recesses into which the end of a depressed rocker button is arranged to engage.

22. A tuning device according to claim 19, wherein the rocker buttons are provided with light conducting portions which are flush with each other in the rest position of the rocker button and complement each other to form a light conductor, whereas, when the rocker button is depressed, the light conductor is interrupted in the region of the depressed button end, so that there an issue of light occurs.

23. A tuning device according to any of claim 19, wherein the rocker buttons are provided on their surface with projections or depressions favouring the issue of light, preferably in the form of signs.

24. A tuning device according to claim 1, wherein potentiometer wipers are disposed on the tuning spindles for co-operation with resistive tracks attached to the housing and wherein the resistive tracks are mounted on both sides of a partition wall disposed between the rows formed by the tuning spindles.

25. A tuning device according to claim 24, wherein the partition wall with the resisitive tracks is adapted to be withdrawn rearwardly from the housing.

References Cited

UNITED STATES PATENTS

| | | | |
|---|---|---|---|
| 2,511,924 | 6/1950 | Lee | 338—200 |
| 2,890,432 | 6/1959 | Rockafellow | 338—128 |

LEWIS H. MYERS, Primary Examiner

D. A. TONE, Assistant Examiner

U.S. Cl. X.R.

338—128